US011680979B2

(12) United States Patent
Hidaka et al.

(10) Patent No.: US 11,680,979 B2
(45) Date of Patent: Jun. 20, 2023

(54) SEMICONDUCTOR DEVICE

(71) Applicant: Mitsubishi Electric Corporation, Tokyo (JP)

(72) Inventors: Hiroki Hidaka, Tokyo (JP); Keisuke Eguchi, Tokyo (JP); Nobuchika Aoki, Tokyo (JP); Rei Yoneyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 146 days.

(21) Appl. No.: 17/243,448

(22) Filed: Apr. 28, 2021

(65) Prior Publication Data

US 2022/0065918 A1    Mar. 3, 2022

(30) Foreign Application Priority Data

Aug. 26, 2020  (JP) .............................. JP2020-142264

(51) Int. Cl.
*G01R 31/26*   (2020.01)
*G01K 7/01*    (2006.01)

(52) U.S. Cl.
CPC ........... *G01R 31/2628* (2013.01); *G01K 7/01* (2013.01); *G01R 31/2632* (2013.01)

(58) Field of Classification Search
CPC ............ G01R 31/2628; G01R 31/2619; G01R 31/2632; G01R 31/3274; G01K 7/01; H01L 2224/0603; H01L 2224/4846; H01L 2224/4911; H01L 2224/49175
See application file for complete search history.

(56) References Cited

U.S. PATENT DOCUMENTS

| 5,001,593 | A  | * | 3/1991  | Zitta ..................... H02H 3/006 361/103 |
| 6,061,221 | A  | * | 5/2000  | Tihanyi .............. H03K 17/0822 361/103 |
| 11,049,785 | B2 | * | 6/2021  | Kubouchi ........... H01L 29/0623 |
| 2018/0241203 | A1 | * | 8/2018  | Irissou .................. H02H 3/085 |
| 2019/0051640 | A1 | * | 2/2019  | Yano .................... H01L 23/481 |
| 2019/0301946 | A1 | * | 10/2019 | Sato .................... H01L 29/4238 |
| 2020/0336686 | A1 | * | 10/2020 | Hosaka .................. H04N 25/75 |

FOREIGN PATENT DOCUMENTS

JP        2019186510 A       10/2019

* cited by examiner

*Primary Examiner* — Thang X Le
(74) *Attorney, Agent, or Firm* — Studebaker & Brackett PC

(57) ABSTRACT

An object is to provide a semiconductor device capable of accurately detecting a temperature of a transistor part and a temperature of the diode part, and improving an overheat protection function. A semiconductor device includes a semiconductor chip having a cell region made up of a plurality of cells including cells corresponding to a transistor part and a diode part, respectively, a temperature detection part detecting a temperature of the transistor part, and a temperature detection part detecting a temperature of the diode part, the temperature detection part is disposed in the cell corresponding to the transistor part, and the temperature detection part is disposed in the cell corresponding to the diode part.

8 Claims, 9 Drawing Sheets

F I G. 6
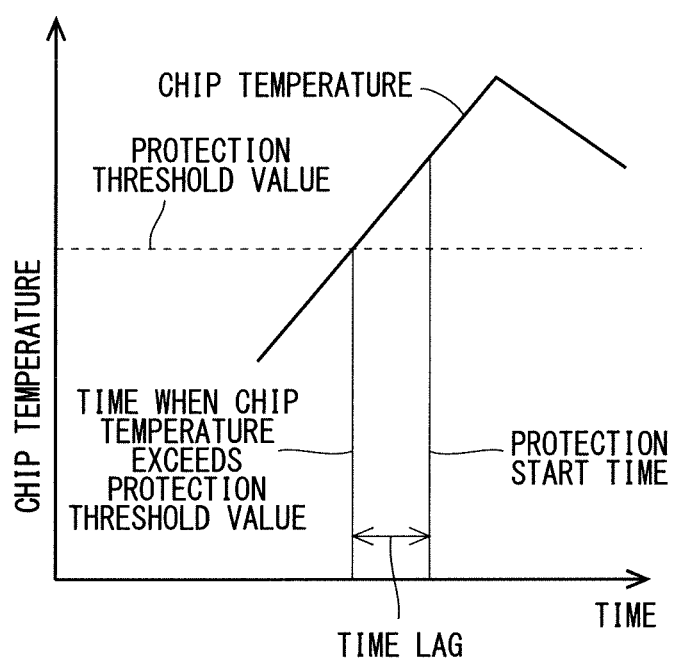

F I G. 7
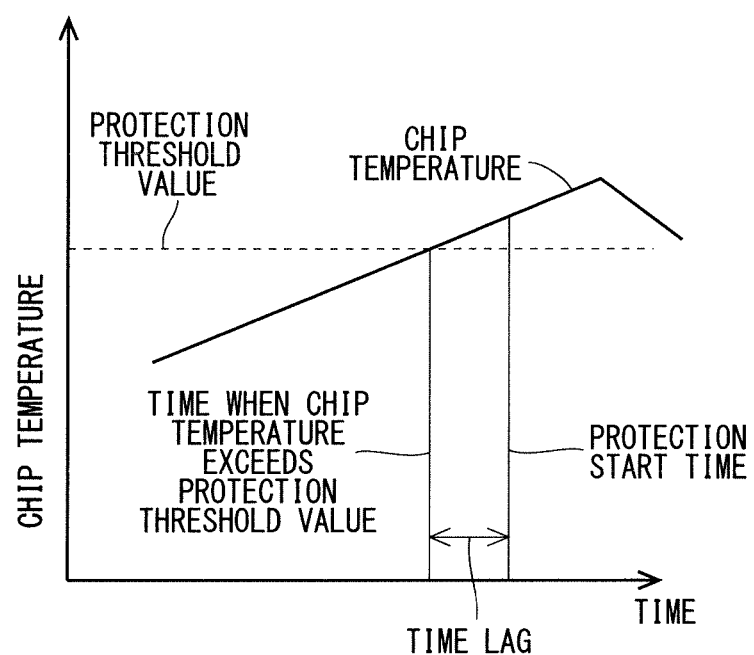

F I G. 8
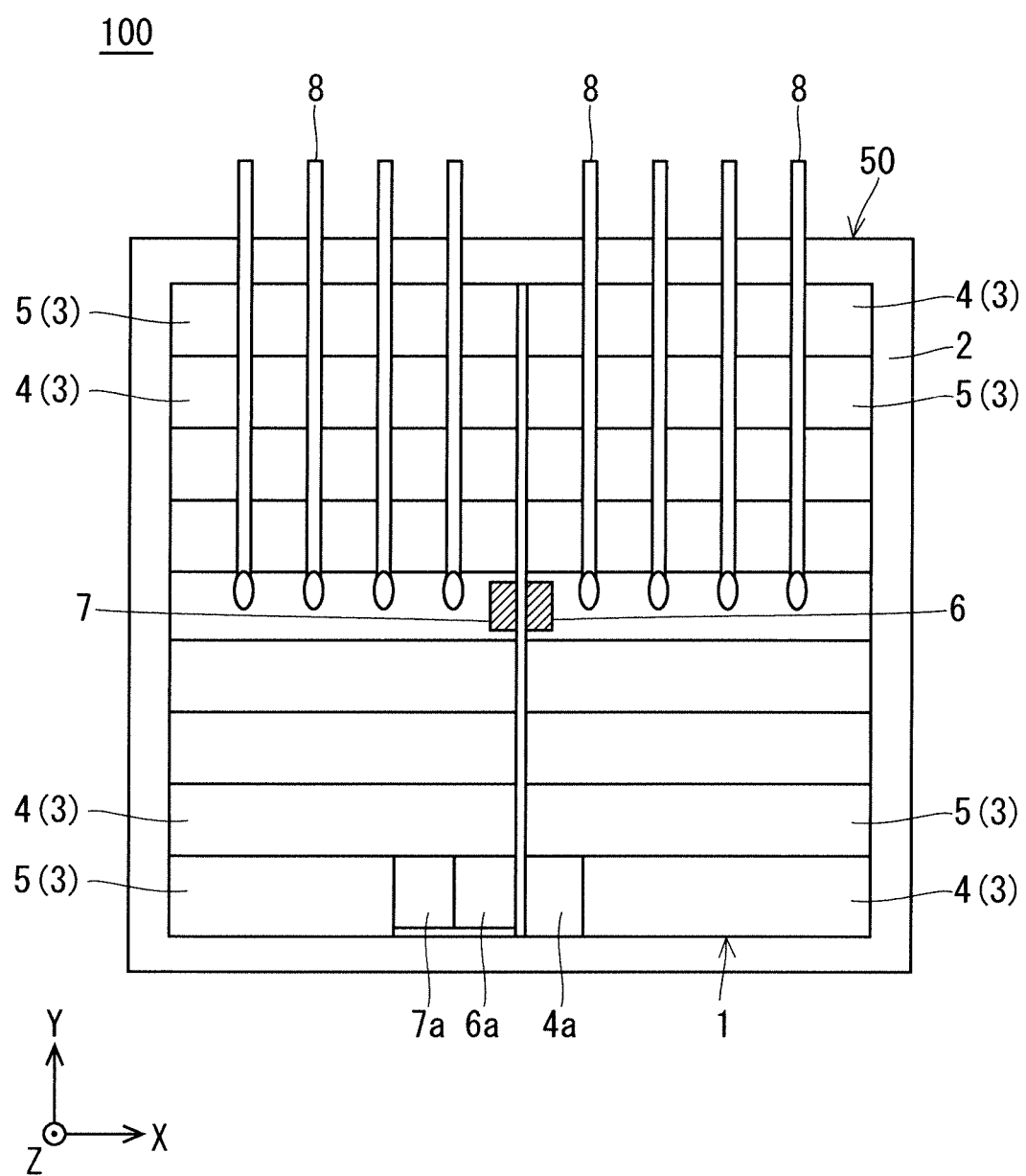

SEMICONDUCTOR DEVICE

BACKGROUND OF THE INVENTION

Field of the Invention

The present disclosure relates to a semiconductor device including a semiconductor chip and a temperature detection part.

Description of the Background Art

There is conventionally a semiconductor device including a semiconductor chip having a cell region made up of a plurality of cells including cells corresponding to a transistor part and a diode part, respectively, and a temperature detection part detecting a temperature of the semiconductor chip. Known is a semiconductor device in which one end portion of an external wiring is connected to a cell around a temperature detection part, thus a temperature of a semiconductor chip can be appropriately detected (for example, refer to Japanese Patent Application Laid-Open No. 2019-186510).

SUMMARY

Recently, the semiconductor device is often used for an application with a load on one of the transistor part and the diode part. A temperature of a portion of the transistor part and the diode part having the load rapidly increases, thus a temperature of each of the transistor part and the diode part needs to be detected accurately.

However, the conventional technique can detect the temperature of the whole semiconductor chip accurately, but has one temperature detection part, thus cannot follow a rapid increase in temperature of each of the transistor part and the diode part, so that it has a problem that a thermal destruction of the semiconductor chip occurs before the temperature detection part detects an overheat of the transistor part and the diode part.

An object of the present disclosure is to provide a semiconductor device capable of accurately detecting a temperature of a transistor part and a temperature of the diode part, and improving an overheat protection function.

A semiconductor device according to the present disclosure includes a semiconductor chip, a first temperature detection part, and a second temperature detection part. The semiconductor chip has a cell region made up of a plurality of cells which include cells corresponding to a transistor part and a diode part, respectively. The first temperature detection part detects a temperature of the transistor part. The second temperature detection part detects a temperature of the diode part. The first temperature detection part is disposed in a cell corresponding to the transistor part and the second temperature detection part is disposed in a cell corresponding to the diode part.

In the semiconductor device, the temperature of the transistor part and the temperature of the diode part can be accurately detected, thus an overheat protection function can be improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is an image diagram illustrating a relationship between a chip temperature and a time in a case where there is no stitch connection.

FIG. 7 is an image diagram illustrating a relationship between a chip temperature and a time in a case where there is a stitch connection.

FIG. 8 is a pattern diagram illustrating a structure of an upper surface of a semiconductor device according to an embodiment 4.

DESCRIPTION OF THE PREFERRED EMBODIMENTS

Embodiment 1

Figure 1:
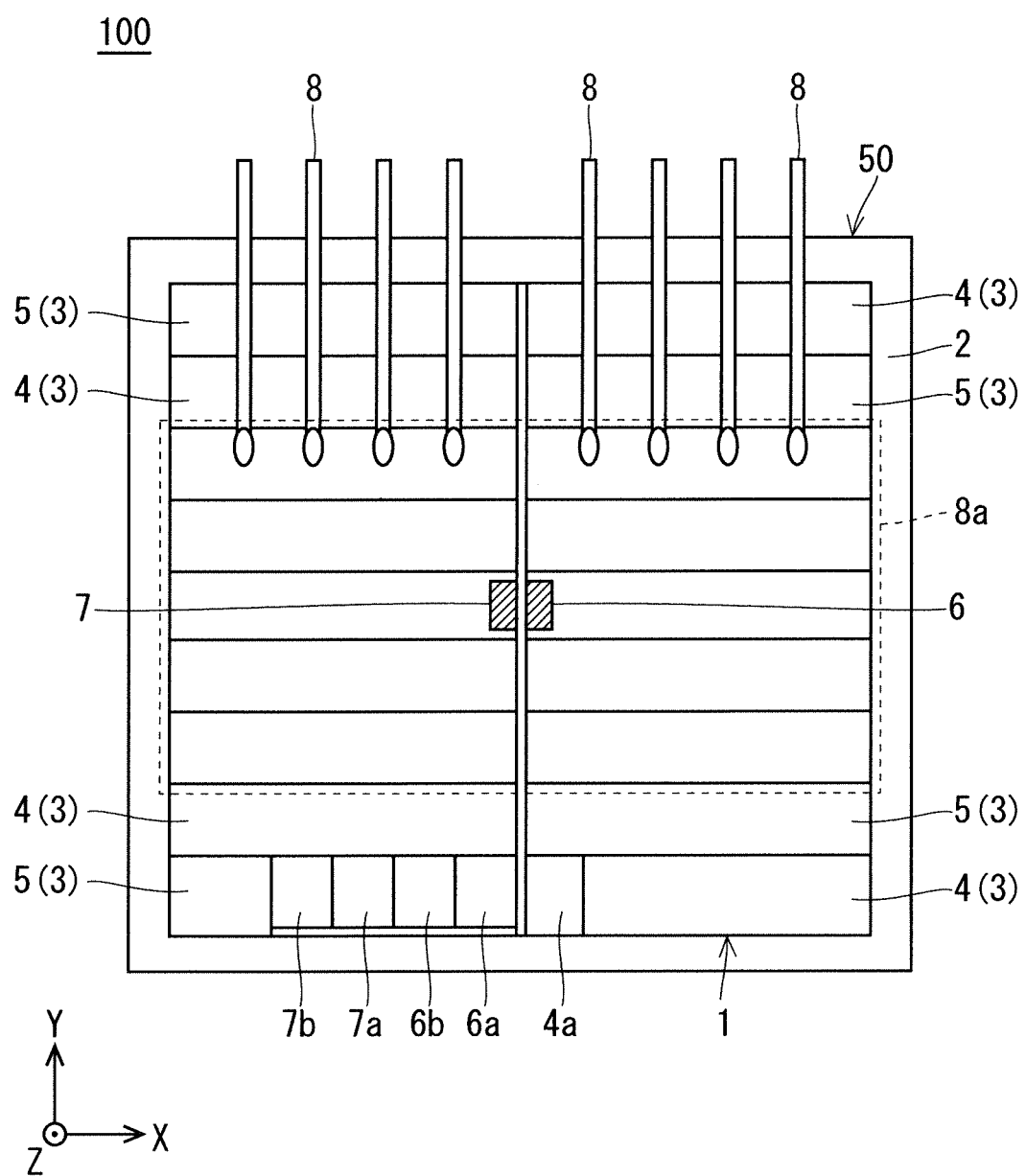
FIG. 1 is a pattern diagram illustrating a structure of an upper surface of a semiconductor device according to an embodiment 1.
Figure 2:
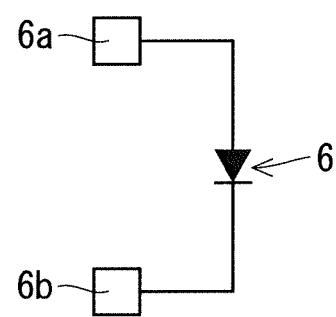
FIG. 2 is a circuit diagram of a first temperature detection part included in the semiconductor device.

An embodiment 1 is described hereinafter using the drawings. FIG. 1 is a pattern diagram of a structure of an upper surface of a semiconductor device 100 according to the embodiment 1. FIG. 2 is a circuit diagram of a temperature detection part 6. XYZ coordinate axes are appropriately illustrated in the drawings to simplify the description. Herein, a +X direction and a −X direction are collectively referred to as an X-axis direction, a +Y direction and −Y direction are collectively referred to as a Y-axis direction, and a +Z direction and −Z direction are collectively referred to as a Z-axis direction.

As illustrated in FIG. 1, a semiconductor device 100 includes a semiconductor chip 50, a temperature detection part 6 as a first temperature detection part, a temperature detection part 7 as a second temperature detection part, and an external wiring 8. The semiconductor device 100 further includes an insulating layer made up of ceramic or resin, a metal pattern formed on the insulating layer, a case having an electrode, a base plate, a cover, a sealing material, and a control substrate mounting a drive circuit and a protection circuit.

A semiconductor chip 50 includes a cell region 1 and a terminal region 2. The cell region 1 is a region made up of a plurality of cells 3 including cells 3 corresponding to the transistor part 4 and the diode part 5, respectively, and is formed into a square shape in a planar view. The terminal region 2 is a region adjacent to an outer peripheral part of the cell region 1, and is formed into a rectangular shape in a planar view.

The cell region 1 is divided into a left portion (a portion in the −X direction) and a right portion (a portion in the +X direction) at a center thereof in the X-axis direction. In the left portion of the cell region 1, the cells 3 corresponding to the transistor part 4 and the diode part 5, respectively, are alternately disposed along the Y-axis direction. Also in the right portion of the cell region 1, the cells 3 corresponding to the transistor part 4 and the diode part 5, respectively, are alternately disposed along the Y-axis direction. In the same position in the Y-axis direction, the cells 3 disposed in the left portion and the right portion of the cell region 1 are different from each other.

A semiconductor chip 50 includes a plural groups of the transistor part 4 and the diode part 5. An internal wiring is used for connecting the transistor part 4 and the diode part 5 and connecting the transistor parts 4.

The temperature detection part 6 detects a temperature of the transistor part 4. Specifically, as illustrated in FIG. 1 and FIG. 2, the temperature detection part 6 is a temperature sense diode, and is disposed in the cell 3 corresponding to one transistor part 4 in the plurality of transistor parts 4. An anode of the temperature detection part 6 is connected to a signal pad of a high potential part 6a in an end portion of the cell region 1 in the −Y direction using an internal wiring, and a cathode of the temperature detection part 6 is connected to a signal pad of a reference potential part 6b using an internal wiring. The signal pad of the reference potential part 6b is disposed in the cell 3 adjacent to the cell 3 where the signal pad of the high potential part 6a is disposed. A signal pad of a gate electrode 4a of the transistor part 4 is disposed in the cell 3 facing the signal pad of the high potential part 6a with a center in the X-axis direction therebetween.

The temperature detection part 7 detects a temperature of the diode part 5. Specifically, the temperature detection part 7 is a temperature sense diode, and is disposed in the cell 3 corresponding to one diode part 5 in the plurality of diode part 5. An anode of the temperature detection part 7 is connected to the signal pad of the high potential part 7a in an end portion of the cell region 1 in the −Y direction using an internal wiring, and a cathode of the temperature detection part 7 is connected to the signal pad of the reference potential part 7b using an internal wiring. The signal pad of the high potential part 7a is disposed in the cell 3 adjacent to the cell 3 where the signal pad of the reference potential part 6b is disposed. The signal pad of the reference potential part 7b is disposed in the cell 3 adjacent to the cell 3 where the signal pad of the high potential part 7a is disposed.

As illustrated in FIG. 1, the external wiring 8 is a wiring connecting the cell region 1 of the semiconductor chip 50 and an electrode of a case. The plurality of external wirings 8 are provided, and one end portion of each of the plurality of external wirings 8 is connected to the cell 3 located around the cells 3 where the temperature detection parts 6 and 7 are disposed, respectively. Herein, an area around the cells 3 where the temperature detection parts 6 and 7 are disposed, respectively, is a region 8a extending by twice a length of the cell 3 in both the +Y direction and −Y direction from the cells 3 where the temperature detection parts 6 and 7 are disposed, respectively.

Current tends to flow around the external wiring 8, thus the temperature around the external wiring 8 tends to become highest as a tendency of a heat generation distribution in the semiconductor chip 50. The temperature detection part 6 is disposed around the external wiring 8 connected to the cell 3 located around the cell 3 corresponding to the transistor part 4, thus can mainly detect the temperature of the transistor part 4 accurately.

In the meanwhile, the temperature detection part 7 is disposed around the external wiring 8 connected to the cell 3 located around the cell 3 corresponding to the diode part 5, thus can mainly detect the temperature of the diode part 5 accurately. The temperature detection part 6 and the temperature detection part 7 detect the temperature of the transistor part 4 and the diode part 5 around the external wiring 8 tending to have a large amount of heat generation, thus can accurately detect the temperature of each of the transistor part 4 and the diode part 5 at a time of generating heat.

In FIG. 1, one end portion of each of the plurality of external wirings 8 is connected to the cell 3 located around the cells 3 where the temperature detection part 6 and the temperature detection part 7 are disposed, respectively. It is sufficient that at least one end portion of the plurality of external wirings 8 is connected to at least one of the cells 3 located around the cells 3 where the temperature detection part 6 and the temperature detection part 7 are disposed, respectively.

As described above, the semiconductor device 100 according to the embodiment 1 includes the semiconductor chip 50 having the cell region 1 made up of the plurality of cells 3 including the cells 3 corresponding to the transistor part 4 and the diode part 5, respectively, the temperature detection part 6 detecting the temperature of the transistor part 4, and the temperature detection part 7 detecting the temperature of the diode part 5, the temperature detection part 6 is disposed in the cell 3 corresponding to the transistor part 4, and the temperature detection part 7 is disposed in the cell 3 corresponding to the diode part 5.

Accordingly, in the semiconductor device 100, the temperature of the transistor part 4 and the temperature of the diode part 5 can be accurately detected, thus an overheat protection function can be improved.

The current tends to flow around the external wiring 8, thus the temperature around the external wiring 8 tends to become highest as the tendency of the heat generation distribution in the semiconductor chip 50.

The semiconductor device 100 further includes at least one external wiring 8 in which one end portion is connected to at least one of the cells 3 located around the cells 3 where the temperature detection part 6 and the temperature detection part 7 are disposed, respectively, thus can detect the temperature of the heat-generating portion in which the temperature becomes highest. Accordingly, an overheat protection can be performed before a thermal destruction of the semiconductor chip 50 occurs.

Embodiment 2

Figure 3:
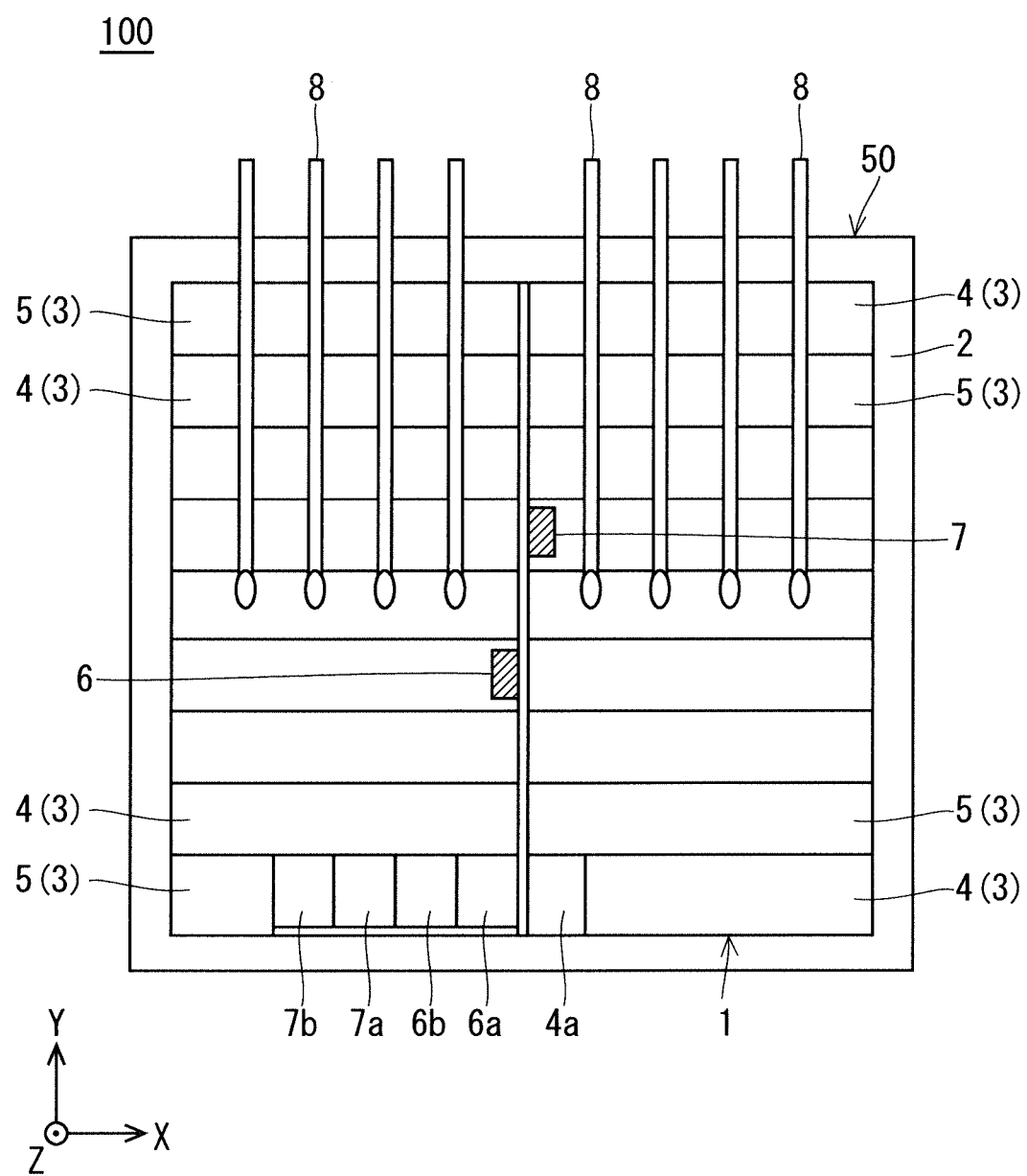
FIG. 3 is a pattern diagram illustrating a structure of an upper surface of a semiconductor device according to an embodiment 2.
Figure 4:
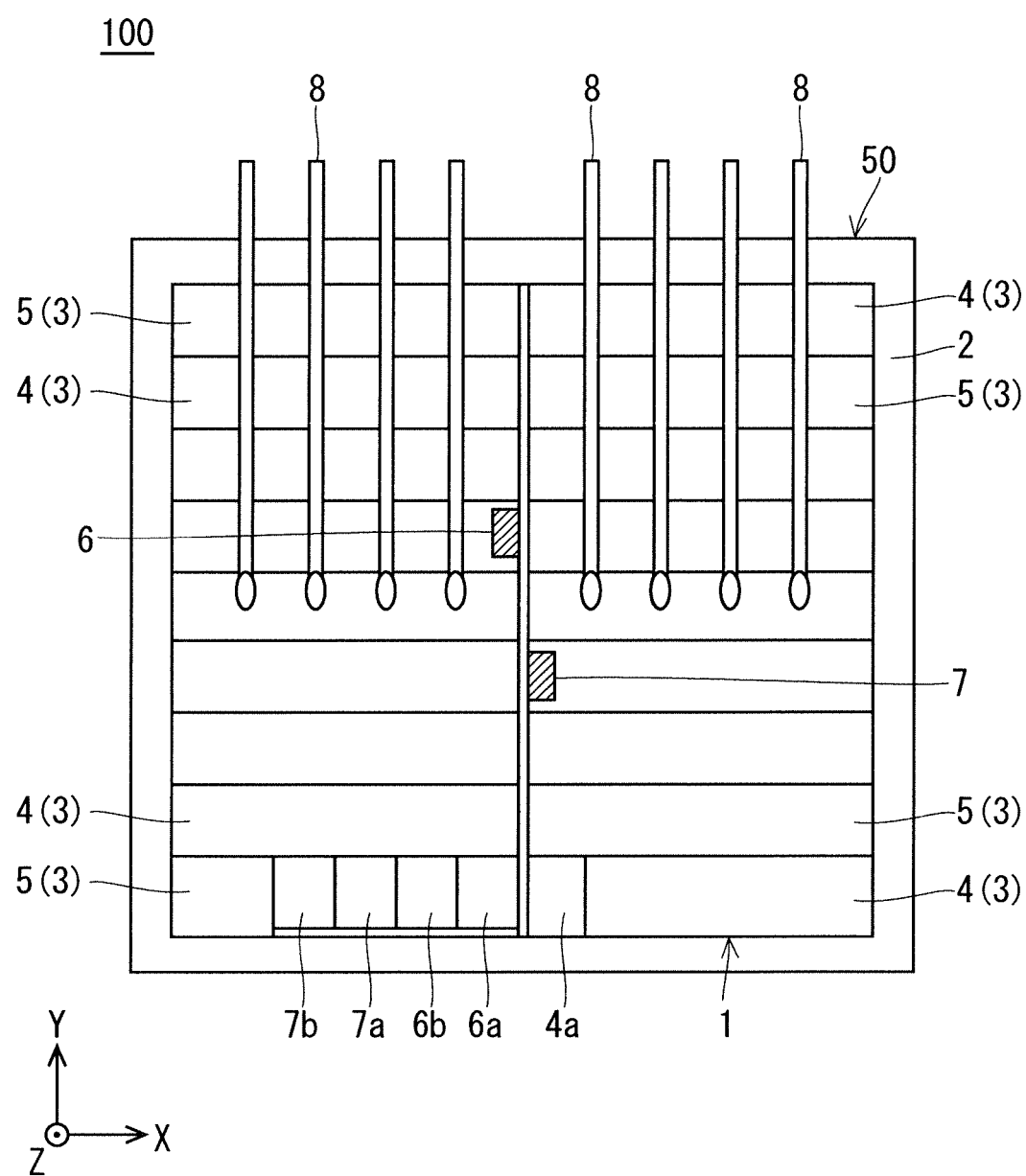
FIG. 4 is a pattern diagram illustrating a structure of an upper surface in another example of the semiconductor device according to the embodiment 2.

Next, a semiconductor device 100 according to an embodiment 2 is described. FIG. 3 is a pattern diagram of a structure of an upper surface of the semiconductor device 100 according to the embodiment 2. FIG. 4 is a pattern diagram of a structure of an upper surface in another example of the semiconductor device 100 according to the embodiment 2. In the embodiment 2, the same reference numerals are assigned to the same constituent elements described in the embodiment 1, and the description thereof will be omitted.

As illustrated in FIG. 3 and FIG. 4, in the embodiment 2, one end portion of each of the plurality of external wirings 8 is connected to the cell 3 adjacent to the cells 3 where the temperature detection part 6 and the temperature detection part 7 are disposed, respectively. One end portion of each of the plurality of external wirings 8 is connected to a position close to the temperature detection part 6 and the temperature detection part 7 compared with the case of FIG. 1, thus the temperature detection accuracy can be improved.

In FIG. 3 and FIG. 4, one end portion of each of the plurality of external wirings 8 is connected to the cell 3 adjacent to the cells 3 where the temperature detection part 6 and the temperature detection part 7 are disposed, respectively. However, it is sufficient that one end portion of at least one of the plurality of external wirings 8 is connected to at least one of the cells 3 adjacent to the cells 3 where the temperature detection part 6 and the temperature detection part 7 are disposed, respectively.

As described above, in the semiconductor device 100 according to the embodiment 2, one end portion of at least one external wiring 8 is connected to at least one of the cells 3 adjacent to the cells 3 where the temperature detection part 6 and the temperature detection part 7 are disposed, respectively, thus one end portion of at least one external wiring 8 is connected to the position close to the temperature detection part 6 and the temperature detection part 7 compared with the case in the embodiment 1. Accordingly, the temperature detection accuracy of the temperature detection part 6 and the temperature detection part 7 can be improved.

Embodiment 3

Figure 5:
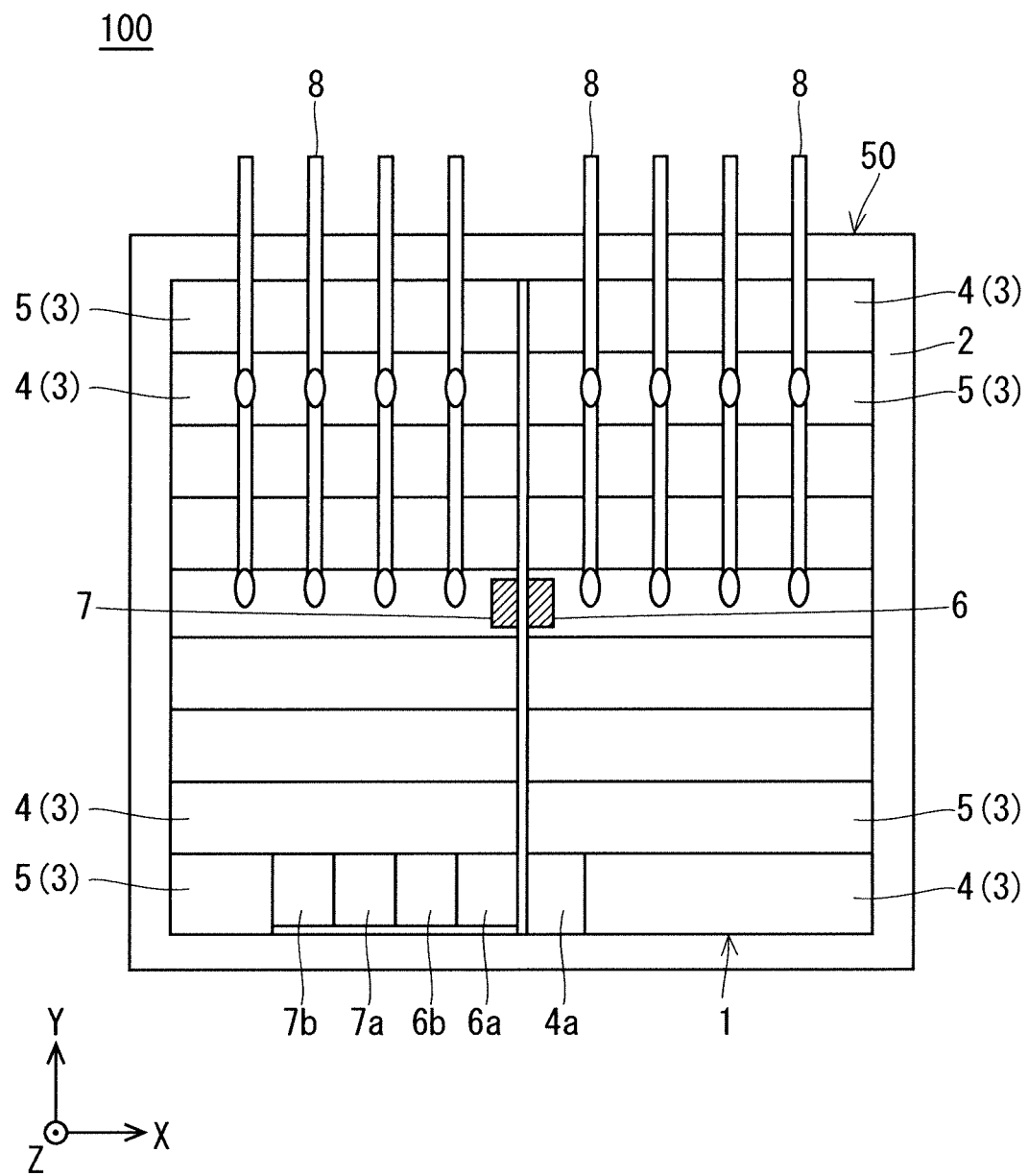
FIG. 5 is a pattern diagram illustrating a structure of an upper surface of a semiconductor device according to an embodiment 3.

Next, a semiconductor device 100 according to an embodiment 3 is described. FIG. 5 is a pattern diagram of a structure of an upper surface of the semiconductor device 100 according to the embodiment 3. In the embodiment 3, the same reference numerals are assigned to the same constituent elements described in the embodiments 1 and 2, and the description thereof will be omitted.

As illustrated in FIG. 5, in the embodiment 3, the connection by the external wiring 8 is a stitch connection connected to the cell region 1 at a plurality of positions. The stitch connection indicates a connection method of connecting each external wiring 8 and the semiconductor chip 50 at a plurality of positions. When there is no stitch connection, each external wiring 8 and the semiconductor chip 50 are connected at one position. In contrast, when there is a stitch connection, each external wiring 8 and the semiconductor chip 50 are connected at two positions. The number of positions at which each external wiring 8 and the semiconductor chip 50 are connected is increased, thus overheat protection accuracy can be improved. The stitch connection may be performed so that each external wiring 8 and the semiconductor chip 50 are connected at three or more positions.

Described next using FIG. 6 and FIG. 7 is a reason why the overheat protection accuracy can be improved by connecting the external wiring 8 by the stitch connection. FIG. 6 is an image diagram illustrating a relationship between a temperature of the semiconductor chip 50 (also referred to as "the chip temperature" hereinafter) and a time in the case where there is no stitch connection. FIG. 7 is an image diagram illustrating a relationship between a chip temperature and a time in the case where there is a stitch connection.

As described above, the external wiring 8 is connected by the stitch connection, thus the number of positions at which the external wiring 8 and the semiconductor chip 50 are connected can be increased. There is a tendency that a large amount of heat is generated in the positions in the semiconductor chip 50 at which the external wiring 8 is connected and a surrounding area thereof, thus the heat generation can be dispersed by increasing the number of positions at which the external wiring 8 and the semiconductor chip 50 are connected.

As illustrated in FIG. 6 and FIG. 7, the external wiring 8 is connected by the stitch connection to disperse the heat generation, thus a speed of increase in the chip temperature can be reduced compared with the case of no stitch connection. Generally, a protection threshold value which is a temperature at which the overheat protection is started is set in the temperature detection part. When the overheat protection is performed, a time lag occurs from a moment the chip temperature exceeds the protection threshold value until the overheat protection is actually started. Thus, the speed of increase in the chip temperature is large, the chip temperature increases during the time lag in some cases. When the speed of increase in the chip temperature is small, the increase in the chip temperature during the time lag can be suppressed, thus the overheat protection can be completed at a temperature close to the protection threshold value. Accordingly, the overheat protection accuracy can be improved.

As described above, in the semiconductor device 100 according to the embodiment 3, the connection by at least one external wiring 8 is the stitch connection connected to the cell region 1 at the plurality of positions. Accordingly, the occurrence of rapid increase in the temperature in the semiconductor chip 50 can be reduced, thus the overheat protection accuracy can be improved.

Embodiment 4

Figure 9:
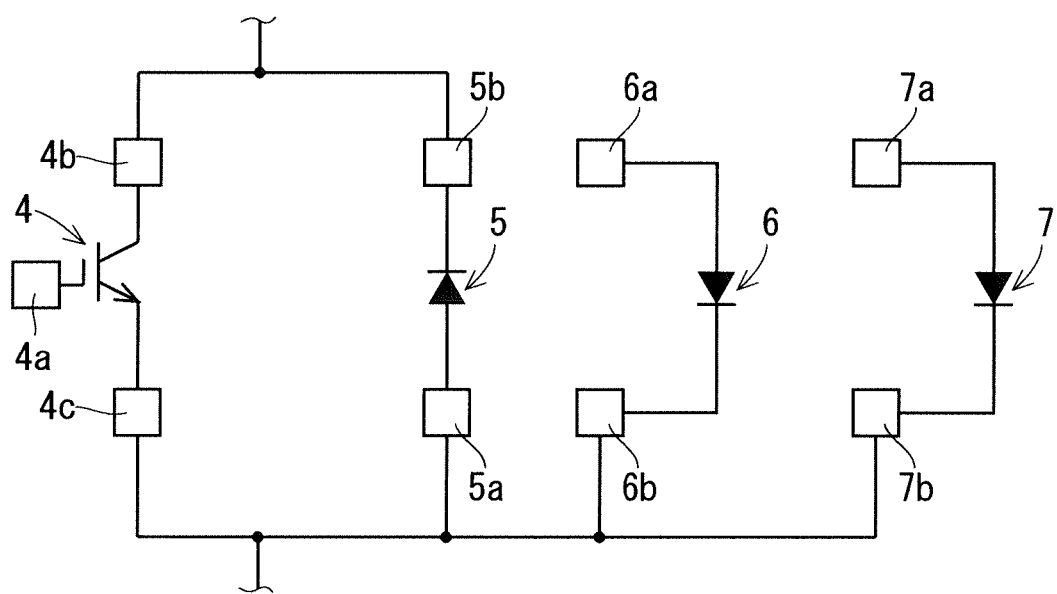
FIG. 9 is an inner connection diagram of a transistor part, a diode part, the first temperature detection part, and a second temperature detection part included in the semiconductor device.

Next, a semiconductor device 100 according to an embodiment 4 is described. FIG. 8 is a pattern diagram of a structure of an upper surface of the semiconductor device 100 according to the embodiment 4. FIG. 9 is an inner connection diagram of the transistor part 4, the diode part 5, the temperature detection part 6, and the temperature detection part 7. In the embodiment 4, the same reference numerals are assigned to the same constituent elements described in the embodiments 1 to 3, and the description thereof will be omitted.

As illustrated in FIG. 8 and FIG. 9, the reference potential part 6b of the temperature detection part 6, the reference potential part 7b of the temperature detection part 7, an emitter electrode 4c of the transistor part 4, and an anode electrode 5a of the diode part 5 are connected to each other by an internal wiring, and have the same potential. The signal pads of the reference potential parts 6b and 7b of the temperature detection parts 6 and 7 are communalized with the emitter electrode 4c of the transistor part 4 and the anode electrode 5a of the diode part 5, thus the signal pads of the reference potential parts 6b and 7b can be reduced. A collector electrode 4b of the transistor part 4 and a cathode electrode 5b of the diode part 5 are connected by an internal wiring, and have the same potential.

As described above, in the semiconductor device 100 according to the embodiment 4, the reference potential part 6b of the temperature detection part 6, the reference potential part 7b of the temperature detection part 7, an emitter electrode 4c of the transistor part 4, and the anode electrode 5a of the diode part 5 are connected to each other by the internal wiring. Accordingly, the signal pads of the reference potential parts 6b and 7b of the temperature detection parts 6 and 7 can be reduced. Accordingly, an effective area of the semiconductor chip 50 can be increased.

Embodiment 5

Next, a semiconductor device 100 according to an embodiment 5 is described. In the embodiment 5, the same reference numerals are assigned to the same constituent elements described in the embodiments 1 to 4, and the description thereof will be omitted.

In the embodiment 5, a first protection threshold value which is a temperature at which the overheat protection of the transistor part 4 is started is set in the temperature detection part 6, and a second protection threshold value which is a temperature at which the overheat protection of the diode part 5 is started is set in the temperature detection part 7. The second protection threshold value is set smaller than the first protection threshold value.

The semiconductor device 100 is used in a servo system in some cases, and the servo system has a lock mode in which particularly the diode part 5 is in an overheat state. When an energizing current is blocked by the overheat protection function, the energizing current becomes a reflux current and flows in the diode part 5, and the energizing current is gradually consumed, thus the current blocking is completed. Thus, when the overheat protection function is operated at the time of overheat of the diode part 5, the temperature of the diode part 5 is higher at the time of completing the current blocking than the time of starting the current blocking in some cases. The protection threshold value of the temperature detection part 7 is set smaller than that of the temperature detection part 6, thus further heat generation in the diode part 5 due to the reflux current in the case where the overheat protection function is operated at the time of overheat of the diode part 5 can be suppressed.

As described above, in the semiconductor device 100 according to the embodiment 5, the first protection threshold value which is the temperature at which the overheat protection of the transistor part 4 is started is set in the temperature detection part 6, and the second protection threshold value which is the temperature at which the overheat protection of the diode part 5 is started is set in the temperature detection part 7, thus the temperature detection accuracy can be improved in accordance with the heat generation tendency of the semiconductor chip 50.

The second protection threshold value is set smaller than the first protection threshold value, thus further heat generation in the diode part 5 due to the reflux current in the case where the overheat protection function is operated at the time of overheat of the diode part 5 can be suppressed. Accordingly, the thermal destruction of the semiconductor chip 50 can be suppressed.

Each embodiment can be arbitrarily combined, or each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising
    a semiconductor chip having a cell region made up of a plurality of cells which include cells corresponding to a transistor part and a diode part, respectively;
    a first temperature detection part detecting a temperature of the transistor part; and
    a second temperature detection part detecting a temperature of the diode part, wherein
    the first temperature detection part is disposed in a cell corresponding to the transistor part,
    the second temperature detection part is disposed in a cell corresponding to the diode part, and
    the first temperature detection part detects the temperature of the transistor part independent of the second temperature detection part that detects the temperature of the diode part.

2. The semiconductor device according to claim 1, further comprising
    at least one external wiring in which one end portion is connected to at least one of the cells located around the cells where the first temperature detection part and the second temperature detection part are disposed, respectively.

3. The semiconductor device according to claim 2, wherein
    the one end portion of the at least one external wiring is connected to at least one of the cells adjacent to the cells where the first temperature detection part and the second temperature detection part are disposed, respectively.

4. The semiconductor device according to claim 2, wherein
    a connection by the at least one external wiring is a stitch connection connected to the cell region at a plurality of positions.

5. The semiconductor device according to claim 1, wherein
    a first protection threshold value which is a temperature at which an overheat protection of the transistor part is started is set in the first temperature detection part, and
    a second protection threshold value which is a temperature at which an overheat protection of the diode part is started is set in the second temperature detection part.

6. The semiconductor device according to claim 5, wherein
    the second protection threshold value is set smaller than the first protection threshold value.

7. The semiconductor device according to claim 1, wherein the first and second temperature detection parts each have at least one respective signal pad to permit independent reading of signals indicative of the temperature of the respective transistor and diode parts.

8. A semiconductor device, comprising
    a semiconductor chip having a cell region made up of a plurality of cells which include cells corresponding to a transistor part and a diode part, respectively;
    a first temperature detection part detecting a temperature of the transistor part; and
    a second temperature detection part detecting a temperature of the diode part, wherein
    the first temperature detection part is disposed in a cell corresponding to the transistor part,
    the second temperature detection part is disposed in a cell corresponding to the diode part, and
    a reference potential part of the first temperature detection part, a reference potential part of the second temperature detection part, an emitter electrode of the transistor part, and an anode electrode of the diode part are connected to each other by an internal wiring.

* * * * *